United States Patent
Reiherzer et al.

(10) Patent No.: US 9,691,949 B2
(45) Date of Patent: Jun. 27, 2017

(54) SUBMOUNT BASED LIGHT EMITTER COMPONENTS AND METHODS

(71) Applicant: Cree, Inc., Durham, NC (US)

(72) Inventors: Jesse Colin Reiherzer, Wake Forest, NC (US); Sung Chul Joo, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/292,331

(22) Filed: May 30, 2014

(65) Prior Publication Data

US 2015/0349218 A1    Dec. 3, 2015

(51) Int. Cl.
| | |
|---|---|
| H01L 21/00 | (2006.01) |
| H01L 33/56 | (2010.01) |
| H01L 27/15 | (2006.01) |
| H01L 25/075 | (2006.01) |
| H01L 23/00 | (2006.01) |

(Continued)

(52) U.S. Cl.
CPC .............. H01L 33/56 (2013.01); H01L 24/97 (2013.01); H01L 25/0753 (2013.01); H01L 27/15 (2013.01); H01L 25/167 (2013.01); H01L 33/486 (2013.01); H01L 33/507 (2013.01); H01L 33/52 (2013.01); H01L 33/60 (2013.01); H01L 33/62 (2013.01); H01L 2224/48091 (2013.01); H01L 2224/48137 (2013.01); H01L 2224/48227 (2013.01); H01L 2924/181 (2013.01); H01L 2933/005 (2013.01);

(Continued)

(58) Field of Classification Search
CPC ......... H01L 33/60; H01L 33/56; H01L 33/62; H01L 33/507; H01L 33/486
See application file for complete search history.

(56) References Cited

U.S. PATENT DOCUMENTS

| | | |
|---|---|---|
| 7,081,661 B2 | 7/2006 | Takehara et al. |
| 7,213,940 B1 | 5/2007 | Van De Ven et al. |

(Continued)

FOREIGN PATENT DOCUMENTS

| | | |
|---|---|---|
| EP | 1 806 782 A2 | 7/2007 |
| EP | 3149779 A1 | 4/2017 |

(Continued)

OTHER PUBLICATIONS

Notice of Allowance for U.S. Appl. No. 29/492,456 dated Aug. 4, 2015.

(Continued)

*Primary Examiner* — Richard Booth
(74) *Attorney, Agent, or Firm* — Jenkins, Wilson, Taylor & Hunt, P.A.

(57) ABSTRACT

Submount based light emitter components and related methods are disclosed. In some aspects, light emitter components include a ceramic submount, at least a first pair of electrical traces disposed on a first side of the submount, at least a first pair of electrical contacts disposed on a second side of the submount, at least one light emitter chip disposed on the first side of the submount, and a non-ceramic reflector disposed about the at least one light emitter chip. The first pair of electrical contacts is configured to electrical communicate with the first pair of electrical traces. The at least one chip is configured to electrically communicate with the first pair of electrical traces. At least a portion of the reflector is configured to conceal a portion of each trace of the first pair of electrical traces.

45 Claims, 10 Drawing Sheets

(51) Int. Cl.
  *H01L 33/48* (2010.01)
  *H01L 33/62* (2010.01)
  *H01L 33/50* (2010.01)
  *H01L 33/60* (2010.01)
  *H01L 25/16* (2006.01)
  *H01L 33/52* (2010.01)

(52) U.S. Cl.
  CPC .............. *H01L 2933/0033* (2013.01); *H01L 2933/0066* (2013.01)

(56) References Cited

U.S. PATENT DOCUMENTS

| | | |
|---|---|---|
| D597,968 S | 8/2009 | Kobayakawa et al. |
| 7,791,061 B2 | 9/2010 | Edmond et al. |
| D632,659 S | 2/2011 | Hsieh |
| D634,282 S | 3/2011 | Wilson |
| D643,819 S | 8/2011 | Joo et al. |
| D646,647 S | 10/2011 | Chen et al. |
| 8,049,237 B2 | 11/2011 | Yamada et al. |
| 8,058,088 B2 | 11/2011 | Cannon et al. |
| D667,801 S | 9/2012 | Joo et al. |
| D671,509 S | 11/2012 | Moriguchi et al. |
| 8,563,339 B2 | 10/2013 | Tarsa et al. |
| 8,648,373 B2 | 2/2014 | Toyama |
| 8,669,581 B2 | 3/2014 | Jung et al. |
| 8,735,920 B2 | 5/2014 | Ibbetson et al. |
| 8,866,169 B2 | 10/2014 | Emerson et al. |
| 8,940,561 B2 | 1/2015 | Donofrio et al. |
| 9,024,349 B2 | 5/2015 | Chitnis et al. |
| 9,070,850 B2 | 6/2015 | Keller et al. |
| 2004/0208210 A1 | 10/2004 | Inoguchi |
| 2006/0131600 A1 | 6/2006 | Nakaoka et al. |
| 2006/0220050 A1 | 10/2006 | Higaki et al. |
| 2008/0179611 A1 | 7/2008 | Chitnis et al. |
| 2008/0258130 A1 | 10/2008 | Bergmann et al. |
| 2009/0101897 A1 | 4/2009 | Murphy et al. |
| 2010/0320482 A1 | 12/2010 | Tachibana |
| 2013/0011946 A1 | 1/2013 | Hussell |
| 2013/0279169 A1 | 10/2013 | Reiherzer et al. |

FOREIGN PATENT DOCUMENTS

| | | |
|---|---|---|
| WO | WO 2006/054616 A1 | 5/2006 |
| WO | WO 2013/148823 A1 | 10/2013 |
| WO | WO 2015/184245 A1 | 12/2015 |

OTHER PUBLICATIONS

International Search Report and Written Opinion for Application No. PCT/US2015/033153 dated Sep. 4, 2015.
Non-Final Office Action for U.S. Appl. No. 14/292,331 dated Dec. 14, 2015.
Taiwan Office Action for Application No. 104117211 dated May 12, 2016.
Taiwanese Office Action for Application No. 104117211 dated Nov. 29, 2016.
Notice of Publication for European Application No. 15727282 dated Mar. 8, 2017.

SUBMOUNT BASED LIGHT EMITTER COMPONENTS AND METHODS

TECHNICAL FIELD

The subject matter disclosed herein relates generally to light emitter components and methods. More particularly, the subject matter disclosed herein relates to submount based light emitter components and related methods.

BACKGROUND

Light emitting diodes (LEDs) or LED chips are solid state devices that convert electrical energy into light. LED chips can be utilized in light emitter components or packages for providing different colors and patterns of light useful in various lighting and optoelectronic applications. Light emitter components can include surface mount devices (SMDs) which can be mounted directly onto the surface of an underlying circuit component or heat sink, such as a printed circuit board (PCB) or metal core printed circuit board (MCPCB). Conventional SMDs include a leadframe molded in plastic with leads extending from the plastic body, and the leads are configured to directly mount to the underlying circuit component. SMDs can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Components incorporating fewer raw materials at sustained or increased brightness levels using the same or less power are becoming more desirable.

Conventional SMD light emitter components utilize one or more LED chips mounted within a component body. A reflector cavity is integrally formed with the component body and surrounds the LED chips. Typically, the component body and reflector cavity are molded about electrical contacts or leads. Individually molding component bodies about lead frames and forming reflector cavities can be both expensive and time-consuming.

Thus, despite the availability of various SMD light emitter components in the marketplace, a need remains for improved SMD components and methods which can be produced quickly, efficiently, and at a lower cost. In some aspects, improved submount based SMD components can allow for customized components having customized trace configurations, customized reflector wall shapes and/or sizes, customized LED chip connectivity, and/or customized optical elements. Such components can be single or multi-chip components and can make it easier for end-users to justify switching to LED products from a return on investment or payback perspective.

SUMMARY

In accordance with this disclosure, submount based light emitter components and methods having improved manufacturability and customization are provided and described herein. Components and methods described herein can advantageously exhibit improved processing times, ease of manufacture, and/or lower processing costs. Components described herein can be batch processed over a panel and well suited for a variety of applications such as personal, industrial, and commercial lighting applications including, for example, light bulbs and light fixture products and/or applications.

In some aspects, components described herein can comprise a highly reflective submount and at least one additional reflector. The additional reflector can comprise a reflective wall or dam which conceals wirebond connectors, electrostatic protection devices, and/or electrically conductive traces for improved brightness. It is, therefore, an object of the present disclosure to provide light emitter components and methods that are submount based, in some aspects, by allowing a multitude of different components to be created over a panel, without incurring the expense of custom fabricated packages.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
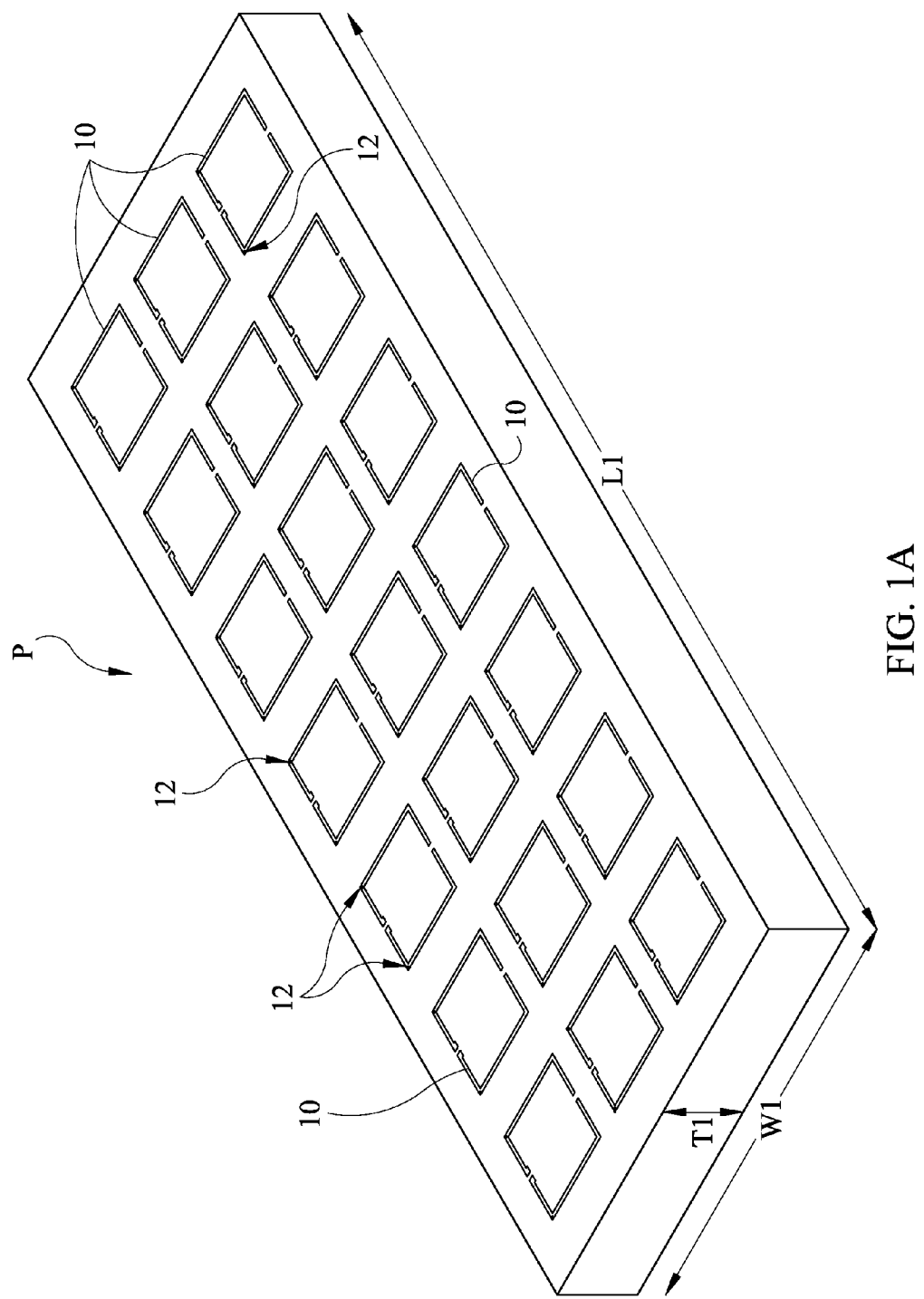
FIGS. 1A to 1C, are perspective views illustrating a panel of light emitter components, or portions thereof, prior to singulation, according to the disclosure herein.

The subject matter disclosed herein is directed to submount based light emitter components and methods, such as submount based light emitting diode (LED) components and methods. In some aspects, the light emitter components and methods can be a surface mount design (SMD), but the disclosure herein is not limited to SMDs. Components and methods provided herein can exhibit improved manufacturability, increased brightness, as well as allow for customized components for supporting LED chips and allowing electrically connectivity thereof, without incurring the expense associated with custom fabricated ceramic or plastic packages.

Notably, individual submounts of submount based light emitter components can be singulated from a larger panel of material, for example, a ceramic substrate, and allow for a plurality of different and/or customized components to be formed thereon. In some aspects, light emitter components and methods described herein exhibit improved manufacturability and improved reflection of light. The light emitter components can be formed over a highly reflective panel and batch processed prior to singulating them from the panel, thereby improving manufacturability. In some aspects, light emitter components described herein can comprise non-metallic submount material(s) that is/are substantially reflective and substantially non-absorbing of light emitted by one or more LED chips. The components can comprise an additional reflector which is non-ceramic, such as a reflective dam or wall.

In some aspects, components herein comprise electrical contacts or traces that can comprise a minimized surface area over portions of the submount to reduce interference with light. In some aspects, the metallic traces are spaced apart from one or more light emitter chips (e.g., LED chips) and can be disposed proximate the outermost edges of the submount to reduce interference with, absorption of, and/or potential blockage of light. Each trace can be disposed below a reflector, such as a reflective wall, "dam", or other reflective structure.

In some aspects, a total amount of combined surface area for at least two metallic traces or electrical contacts can be less than approximately 80% of the overall surface area of the top surface of the submount, less than approximately 60% of the top surface area of the submount, less than approximate 40% of the top surface area of the submount, less than approximately 10% of the top surface area of the submount, or less than approximately 20% of the top surface area of the submount. In some aspects, traces are not exposed on a top surface of a submount, but are disposed below a reflector cavity, wall, or dam.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene.

References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component in addition to the orientation depicted in the figures. For example, if the component in the figures is turned over, structure or portion described as "above" other structures or portions would now be oriented "below" the other structures or portions. Likewise, if components in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein, the terms "through-hole", "thru-hole", and/or "via" are synonymous and refer an opening in the submount, often filled and/or lined (e.g., along one or more side walls) with an electrically conductive material that allows for an electrically conductive conduit or pathway between different layers, surfaces, or features of the component.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB.

Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips can be at least partially coated with one or more phosphors. The phosphors can absorb a portion of light from the LED chip and emit light at a different wavelength such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, white emitting components can consist of an LED chip that emits light in the blue wavelength spectrum and a phosphor that absorbs some of the blue light and re-emits light in the green, yellow, and/or red wavelength spectrum. The components can therefore emit a white light combination across the visible spectrum of light. In other embodiments, the LED chips can emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety.

It is understood that light emitter components and methods according to the present subject matter can also have multiple LED chips of different colors, one or more of which can be white emitting.

FIGS. 1A through 5 illustrate embodiments of submount based light emitter components and related methods according to the present subject matter as disclosed and described herein. In some aspects, the submount based light emitter components comprise SMD components, adapted for connection to portions of a circuit, circuitry, heat sink, and/or other electrically or thermally conductive surfaces. FIGS. 1A to 1E illustrate a portion of a substrate or panel, generally designated P, from which one or more individual submount based light emitter components (e.g., 30, FIGS. 2A to 2H) can be singulated, separated, and/or otherwise physically isolated. A plurality of submount based SMD light emitter components (e.g., 30, FIGS. 2A to 2H) can be formed over panel P. In some aspects, panel P and submount portions thereof form the building blocks for the novel SMD light emitter components herein, as customized components can easily be provided over panel P. Notably, multiple light emitter components can be formed and/or batch processed over panel P, and later separated therefrom. The components can then be sorted and shipped to customers or consumers based upon electrical and/or optical properties.

In some aspects, panel P comprises a substrate comprising any suitable length, such as for example and without limitation a length L1 of approximately 4 inches (") and any suitable width, such as for example a width W1 of approximately 2" (e.g., 4"×2") such that approximately 120 emitter components with individual submounts (e.g., 32, FIG. 2A) of approximately 5 mm×5 mm can be formed thereon and/or singulated therefrom. In other aspects, panel P is approximately 5 inches (") in length L1 and/or width W1, approximately 4" in length L1 and/or width W1, approximately 3" in length L1 and/or width W1, or approximately 2" in length L1 and/or width W1. However, any size and/or shape of panel P can be provided. Any size and/or number of light emitter components can be formed upon and singulated from panel P. Each light emitter component (e.g., 30, FIGS. 2A to 2H) can comprise an individual submount (e.g., 32, FIG. 2A) that is larger or smaller than 5 mm per side (i.e., 10 mm per side, 8 mm per side, 7 mm per side, 4 mm per side, 3 mm per side, or less than 3 mm per side). Non-rectangular and non-square panels and components, respectively, can also be provided.

In some aspects, panel P can further comprise any suitable height or thickness, such as for example a thickness T1 between approximately 0.3 mm and 2.0 mm. For example, in some aspects, panel P comprises a thickness of approximately 1 mm or less, approximately 0.8 mm or less, or approximately 0.5 mm or less. In some aspects, panel P is approximately 0.635 mm thick. In other aspects, panel P is approximately 0.35 mm thick or more. As noted above, any size and/or shape of panel P can be provided.

In some aspects, panel P comprises a non-metallic material, such as a white, silver, or transparent ceramic based material configured to improve light extraction and reflectance. Panel P can comprise a highly reflective aluminum oxide (e.g., alumina or $Al_2O_3$) or aluminum nitride (AlN) panel with reflective particles dispersed therein. Panel P can also comprise any suitable oxide ceramic such as zirconium oxide, or zirconia (ZrO2), or a mixture, composite or alloy of zirconia and/or alumina. Panel P can comprise a powder based (e.g., "green") ceramic that is pressed and fired prior to attachment of one or more LED chips (14, FIG. 1B). Panel P can comprise at least one substantially flat or planar surface over which the one or more LED chips (14, FIG. 1B) can be supported, mounted, and/or attached.

Notably, light emitter components disclosed herein can be batch formed and/or batch processed, to thereby simultaneously form a plurality of customized packages that are submount based and can be provided at lowered costs and/or have improved manufacturability. For example, panel P can be provided with customized light emitters (e.g., customized size, shape, color, number, and/or connectivity of LED chips), traces (e.g., customized size, shape, and/or placement thereof), reflectors (e.g., customized size, shape, material, color, placement thereof), and/or optical elements (e.g., customized shape, size, placement, dome height, etc.) prior to singulation into individual light emitter components. Aspects of the LED chips, traces, reflectors and/or optical elements can be customized to provide light emitter components operable at various electrical and/or optical specifications per customer and/or consumer requests.

In some aspects, panel P is highly reflective to visible light (e.g., greater than about 90%) and provides conduction of heat as well as mechanical support. In some aspects, non-metallic and/or ceramic materials containing $Al_2O_3$ exhibit such desirable qualities. Accordingly, panel P (i.e., and submounts 32, FIG. 2A singulated therefrom) can comprise a ceramic based body of material comprising $Al_2O_3$.

In some aspects, panel P can comprise a ceramic body that can be cast from low temperature co-fired ceramic (LTCC) materials or high temperature co-fired ceramic (HTCC) materials and related processes. In one embodiment, panel P can be cast from a thin green ceramic tape and subsequently fired. Where used, the ceramic tape can comprise any ceramic filler material known in the art, for example, panel P can comprise a glass ceramic, such as $Al_2O_3$ or aluminum nitride (AlN) having 0.3 to 0.5 weight percent of glass frits. The glass frits can be used as a binder and/or sintering inhibitor within the ceramic tape when the tape is fired.

In some aspects, the green ceramic tape can be formed by casting a thick layer of a slurry dispersion of the glass frit, ceramic filler, one or more additional binders, and a volatile solvent. The cast layer can be heated at low temperatures to remove the volatile solvent. Green ceramic tape panels P can advantageously comprise any thickness desired, thus contributing to a thinner size, where desired.

Panel P can further comprise any of a variety of light scattering particles contained therein. Examples of suitable scattering particles can for example comprise particles of $Al_2O_3$, $TiO_2$, $BaSO_4$, $ZrO_2$, and/or AlN. Panel P can be produced by thin- or thick-film processing techniques available at and including products available from CoorsTek, headquartered in Golden, Colo. Such panels P can optionally be fired along with other materials (e.g., zirconia, $ZrO_2$) to further improve optical and mechanical properties. LED chips 14 can be mounted to the panel P after firing and/or sintering thereof.

In some aspects, panel P is similar to and/or provided using methods described in U.S. utility patent application Ser. No. 11/982,275, filed Oct. 31, 2007 and/or U.S. utility patent application Ser. No. 12/757,891, filed Apr. 9, 2010. The entire contents of each of these references are hereby incorporated by reference herein.

Referring to FIG. 1A, a plurality of electrical contacts, such as electrically conductive traces 10, can be provided over panel P. In some aspects, the plurality of traces 10 comprise a plurality of pairs of electrical contacts (e.g., anode/cathode pairs) for supplying current to LED chips (14, FIG. 1B). Traces 10 comprise areas of electrically conductive material, such as metal or a metal alloy, disposed over panel P. Traces 10 can be provided along a top side or surface of panel P via sputtering, electroplating, electroless plating, depositing (e.g., chemical, plasma, vapor, and/or physical deposition), lithography processing, photoresist processing, stenciling, and/or any other suitable process or technique. Traces 10 can be thin, and can optionally comprise one or more layers of material. Traces 10 can be, but do not have to be, disposed proximate outermost areas of submounts formed from panel P, and optionally covered with a reflector or reflective material (e.g., reflective walls 18, FIG. 1C). The size, shape, number, location, thickness, and/or material of traces 10 can be customized for use in various lighting applications. The reflective material or reflector can be disposed proximate to the edge or edges of a submount.

Figure 1B:
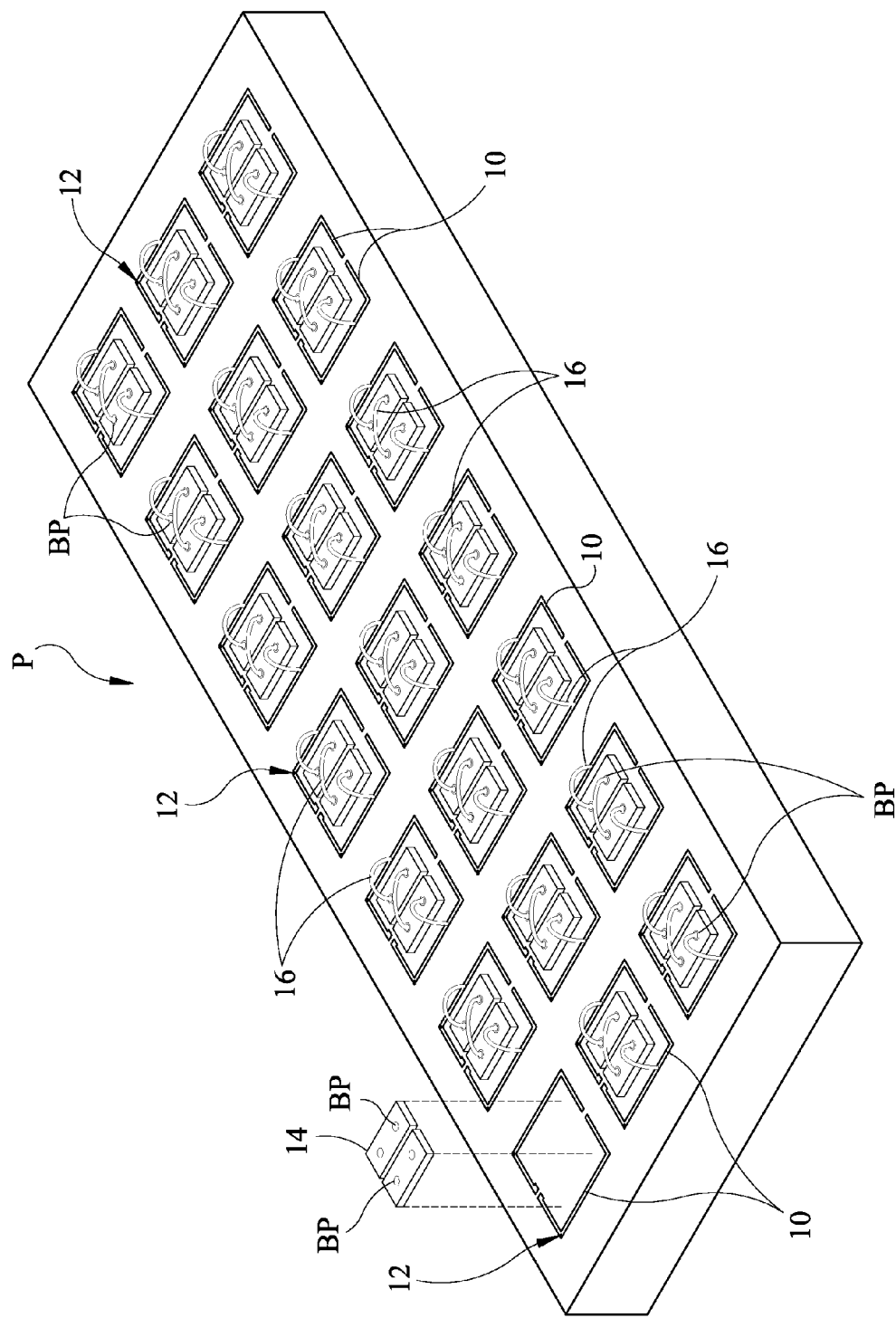

Electrically conductive vias, generally designated 12, can be provided within portions of panel P. In FIGS. 1A and 1B, vias 12 are relatively small in comparison to panel P and are shown in black for illustration purposes. Vias 12 are more readily visible in FIGS. 2A to 2D. Vias 12 can comprise a plurality of openings, apertures, and/or holes extending there-through and/or internally within panel P. Vias 12 can, but do not have to be, vertically aligned or parallel with respect to the vertical axis of panel thickness T1. Vias 12 can be filled and/or plated with electrically conductive material, such that top contacts or traces 10 can electrically communicate with bottom contacts or traces (e.g., 36 and 38, FIG. 2C). Bottom traces (e.g., 36 and 38) can be attached on a back side of panel P, which opposes the surface upon which LED chips 14 are provided. A plurality of bottom traces (e.g., 36 and 38) can be provided on panel P prior to singulation of individual devices 30.

Vias 12 can be formed in panel P via etching, drilling, scribing, punching, forming in a green ceramic tape, or otherwise formed such that the vias penetrate internally and extend within a portion of panel P. In some aspects, vias 12 can be formed by laser drilling an already fired HTCC panel P.

Referring now to FIG. 1B, one or more LED chips 14 can be provided over panel P and supported thereby. LED chips 14 can be spaced apart from the one or more traces 10. In some aspects, each LED chip 14 can have a clearance from it and/or around it such that there is no metallic trace close in proximity thereto. This can improve reflection and brightness of light emitter components formed therefrom. In one example, traces 10 can be positioned a distance away from the closest LED chip 14 such that there is no metallic trace within at least 100 μm or more of the LED chip 14.

In some aspects, at least one LED chip 14 is provided between each pair of traces 10. In some aspects, multiple LED chips 14 are provided between each pair of traces 10. LED chips 14 can be electrically connected to each other and serially connected between traces 10 via wirebonds 16. In other aspects, LED chips 14 can be wirebonded directly to traces 10 via wirebonds 16 and electrically connected in parallel therebetween. Any desired connectively of LED chips 14, including combinations of serially and parallel connected chips, can be provided over panel P. The size, shape, structure, color, number, and/or connectively of LED chips 14 provided between traces 10 can be customized for use in various lighting applications. Various combinations of LED chips 14 and phosphors/lumiphors can also be provided, for providing a desired color and light output from emitter components formed over panel P.

In some aspects, each pair of traces 10 can comprise first and second electrical contacts of opposing electrical polarity for passing electrical current into and out of one or more LED chips 14 causing illumination thereof. In some aspects, traces 10 can be fully disposed on a top side or top surface of panel P and spaced apart from each other and LED chips 14. In some aspects, LED chips 14 can electrically communicate to traces 10 via wirebonds 16. FIGS. 1A to 1B illustrate providing a panel P, providing traces 10 over panel P, attaching LED chips 14 to panel P, and wirebonding LED chips 14 to each other and/or to traces 10. LED chips 14 can be attached to panel P, or portions thereof, via adhesive, solder, flux, metal, epoxy, silicone, or any other attachment method and/or material.

Figure 1C:
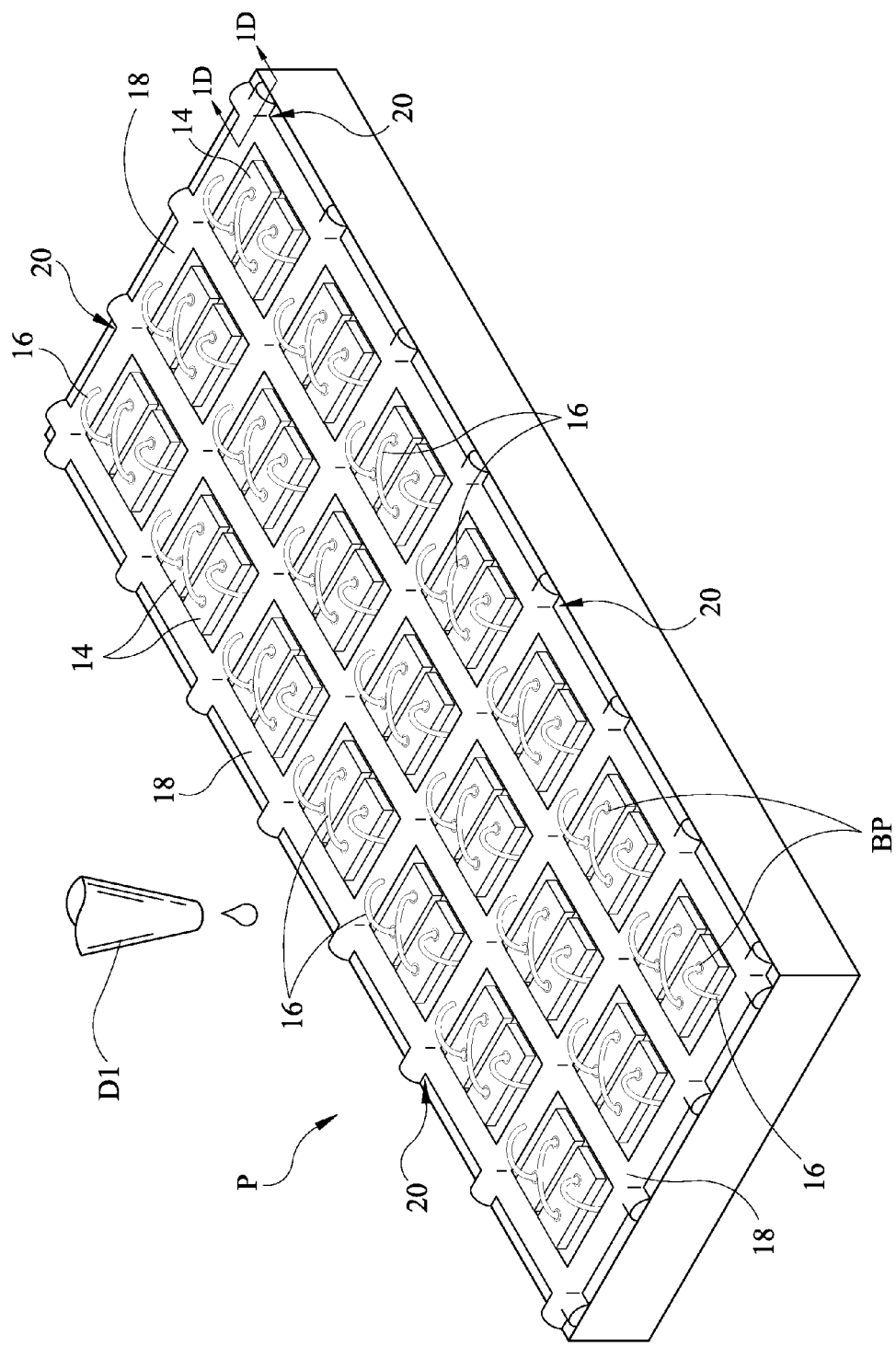

In some aspects, panel P is reflective and comprises a primary reflector of light emitted from LED chips 14. As FIG. 1C illustrates, an additional reflector or reflective structure can be provided, disposed, and/or formed over panel P. An additional reflector and/or reflective structure can be provided about one or more LED chips 14. Notably, the reflector or reflective structure can optionally be provided over portions each trace 10 to improve reflection of light from components (e.g., 30, FIG. 2A) singulated from panel P and/or to prevent light from being absorbed or blocked via traces 10.

In some aspects, the reflector comprises a reflective dam, structure, or wall 18 comprising reflective material dispensed by a tool or dispenser D1. In some aspects, a plurality of reflective walls 18 is dispensed over panel P and over a portion of wirebonds 16. Reflective walls 18 can also be dispensed over and cover traces 10. A plurality of walls 18 can intersect and form a network of walls over panel P, between which an optical filling or filler material (e.g., 22, FIG. 1E) can be provided. Reflective walls 18 can also be dispensed over one or more electrostatic protection devices (i.e., ESD device, 34, FIG. 2A). Reflective walls 18 can intersect for forming walls or dams between adjacent devices or components to be singulated from panel P. In some aspects and upon singulation, reflective walls 18 are cut, sawn, or otherwise exposed for forming external surfaces or walls of individual light emitter components.

In some aspects, reflective walls 18 can comprise a reflective material that is substantially white or silver in color. Reflective walls 18 can comprise a non-ceramic and non-metallic material that is dispensable or extrudable. In some aspects, reflective walls 18 are polymeric and/or plastic. In some aspects, reflective walls 18 can comprise a matrix of silicone or epoxy with fumed silica, and one or more binders, fillers, and/or reflective particles dispersed therein. Reflective particles can comprise titanium dioxide ($TiO_2$), zinc peroxide ($ZnO_2$), silicone dioxide ($SiO_2$), or zirconia ($ZrO_2$) particles. In other aspects, reflective walls 18 are at least partially transparent for emitting light therefrom. Reflective walls 18 can optionally be coated with and/or contain an optical conversion material dispersed therein, such as a lumiphor or phosphor.

Figure 1D:
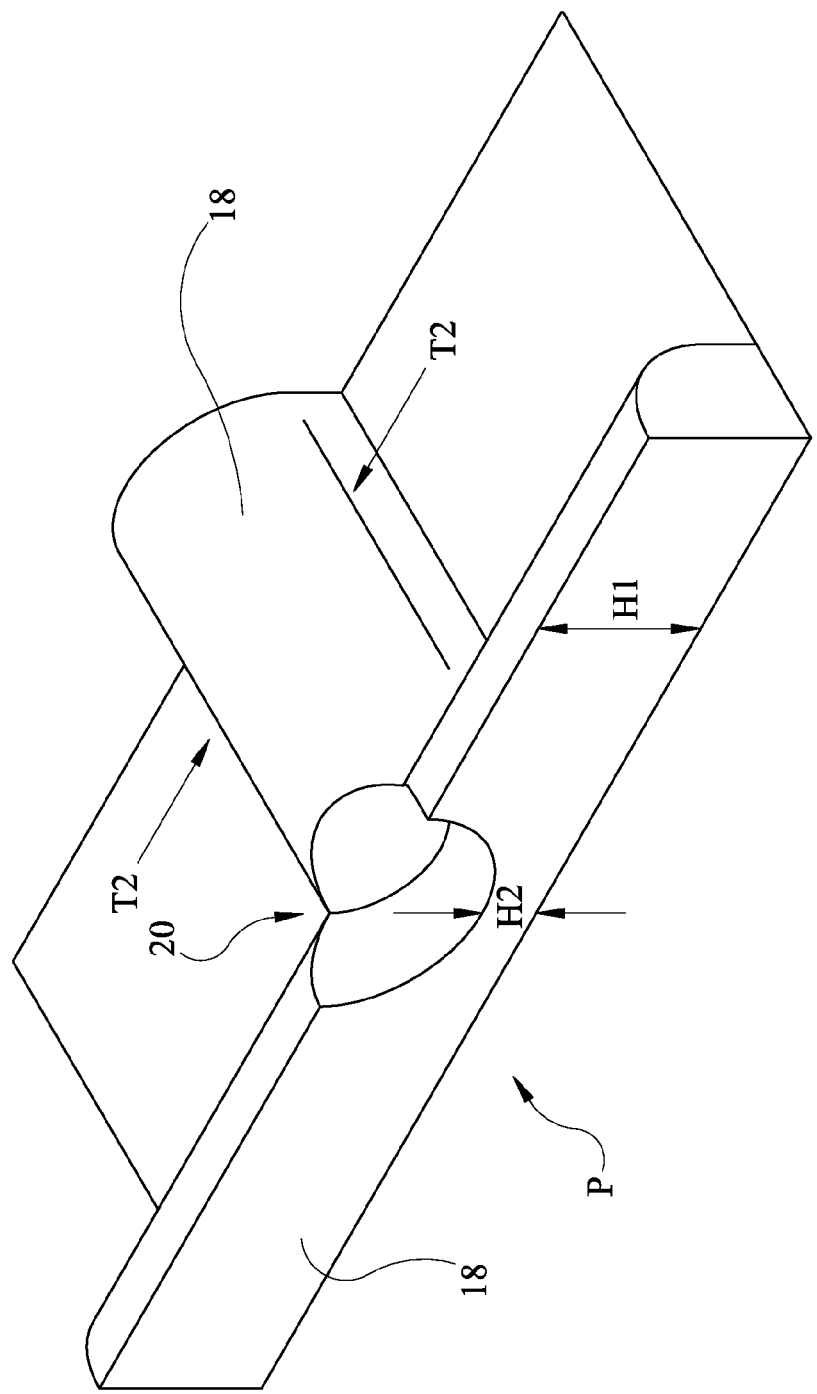
FIG. 1D is a sectional view of FIG. 1C according to the disclosure herein.

FIG. 1D is a sectional view of a portion of panel P and reflective walls 18 in FIG. 1C. As FIG. 1D illustrates, reflective walls 18 can be provided in various thicknesses or heights vertically disposed with respect to panel P. For example, walls can be dispensed in least at a first height H1 and a second height H2 along a longitudinal direction thereof. In some aspects, first height H1 is an overall (e.g., non-overlapping) height and second height H2 is a height of each wall 18 proximate intersections or intersecting points 20. In some aspects, second height H2 is equal to approximately one-half of first height H1, such that walls 18 (e.g., even at overlapping portions) remain substantially uniform in height across panel P.

At intersecting points 20, portions of at least two walls 18 overlap or intersect. First height H1 can be any suitable height, such as for example a height between approximately 0.2 and 1.2 mm. Second height H2 can comprise approximately one-half of first height H1, or any height between approximately 0.1 and 0.6 mm. In some aspects, first height H1 is approximately 0.7 mm and second height H2 is approximately 0.35 mm. Reflective walls 18 can be dispensed to second height H2 at intersecting points 20 between substantially orthogonal walls 18 such that the overall height of at least two intersecting walls (e.g., 2×H2) at intersecting points 20 does not exceed or significantly exceed H1. That is, at intersecting points 20 where at least two walls 18 intersect, each wall 18 is dispensed to second height H2 such that a substantially uniform height across intersecting and non-intersecting portions of reflective walls 18 is achieved. In some aspects, non-overlapping walls of first height H1 and intersecting points 20 comprised of overlapping walls, each of second height H2 (e.g., 2 walls× H2) are substantially uniform, and may vary by less than approximately 0.1 mm, less than approximately 0.05 mm, or less than approximately 0.01 mm.

Still referring to FIG. 1D, reflective walls 18 can also comprise any suitable thickness T2. In some aspects, thickness T2 of each wall can comprise any value between approximately 0.2 and 2.0 mm, however, any thickness T2 may be provided. For example, wall thickness T2 can be approximately 2.0 mm or less, approximately 1.0 mm or less, or approximately 0.5 mm or less.

Figure 1E:
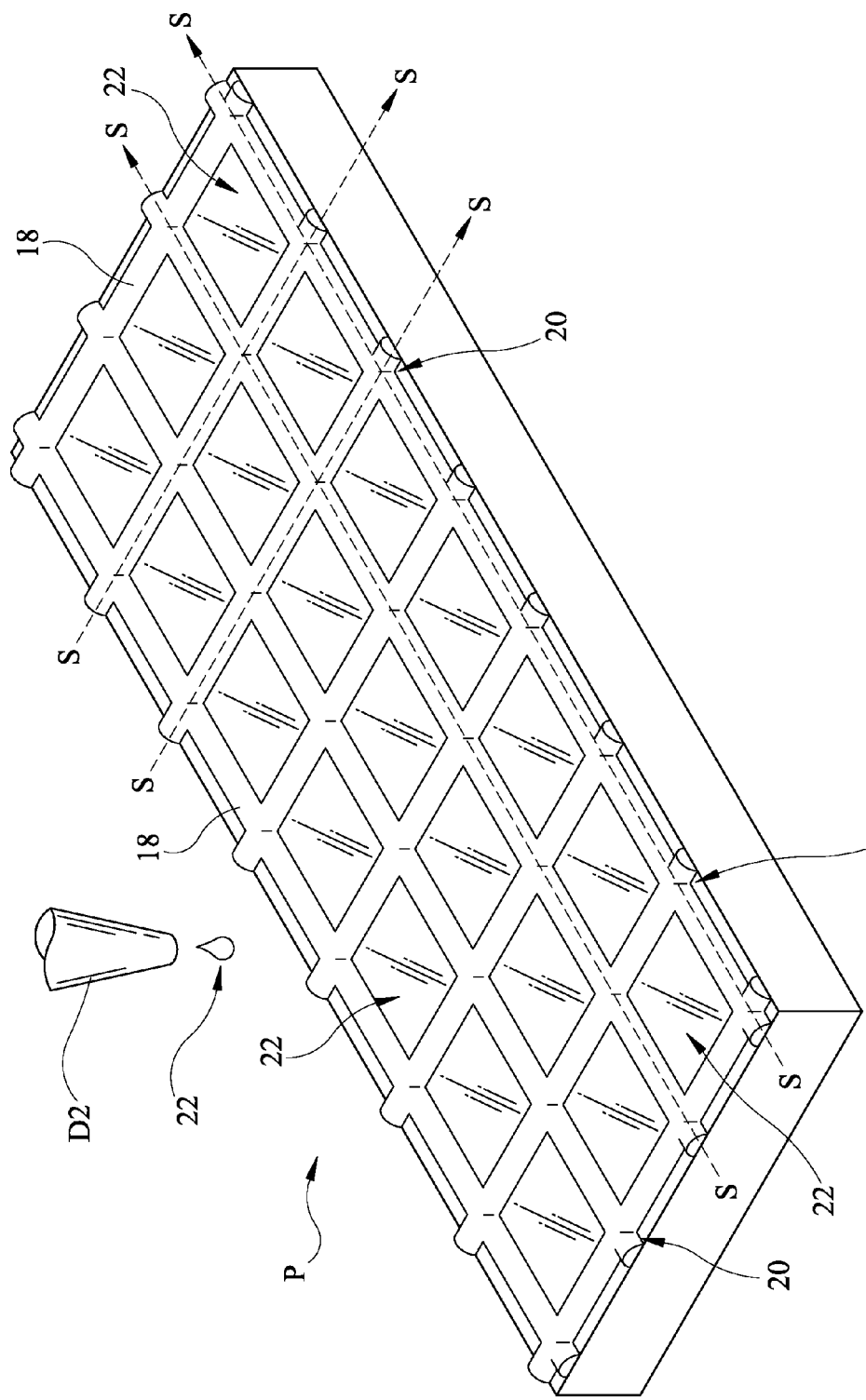
FIG. 1E is a perspective view illustrating a panel of light emitter components according to the disclosure herein.

Referring now to FIG. 1E, a filler material, generally designated 22, can be provided over panel P and retained via walls 18. In some aspects, filler material 22 is dispensed between portions of at least two opposing walls 18 via a dispensing tool or dispenser D2. In other aspects, filler material can be molded and cured. Filler material 22 can comprise an optical element for producing a certain shape, color, and/or beam pattern of light. Filler material 22 can comprise a planar surface, a curved surface, a domed surface, and/or combinations thereof. In some aspects, filler material 22 comprises an encapsulant, where at least a portion of the encapsulant is disposed on a same side or surface of panel P to which LED chips 14 are mounted to, and/or a same side or surface to which traces 10 are deposited to. In some aspects, filler material 22 is formed directly and/or indirectly over a top surface of panel P, and disposed directly over at least one LED chip 14. An array of lenses, domes, or optical elements comprised of filler material 22 can be dispensed and/or positioned over panel P and a corresponding array of LED chips 14. In some aspects, traces 10 and LED chips 14 are provided on a front side of panel P, and SMD contacts (e.g., 36, 38, FIG. 2C) are provided on an opposing, back side of panel P Notably, in some aspects filler material 22 comprises a non-molded optical element. Filler material 22 can comprise a silicone matrix, encapsulant, or plastic material, which can be deposited or dispensed directly over panel P without incurring time or expense associated with overmolding lenses. Filler material 22 can be dispensed to any height between walls 18, and can comprise a height that is greater than or less than first height H1 (FIG. 1D). Filler material 22 can be dispensed and optionally cured prior to singulation of individual devices or components from panel P. In some aspects, filler material 22 may come over and often cover the top and/or sides of walls 18.

Figure 2A:
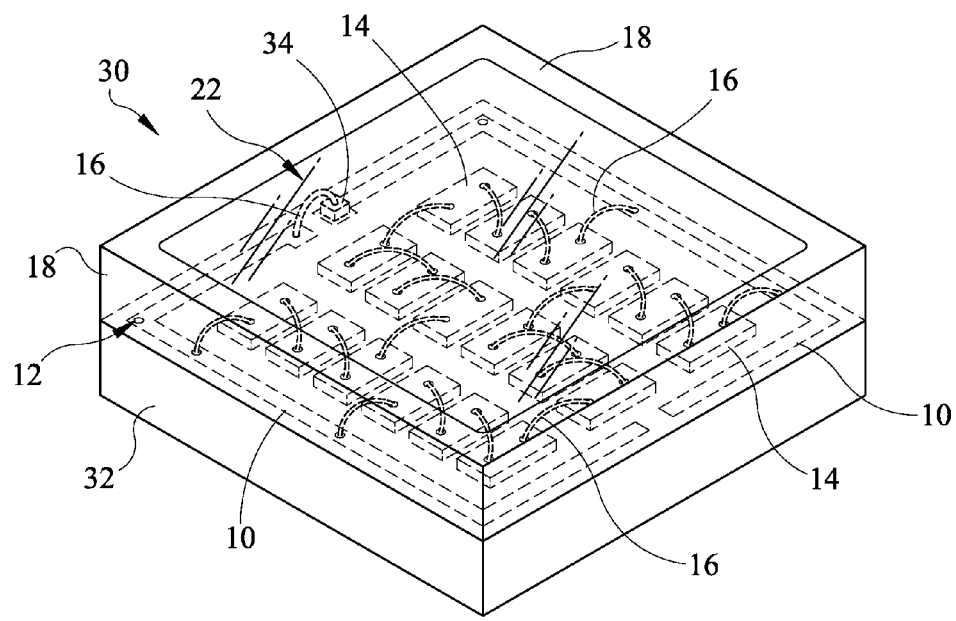
FIGS. 2A to 2D are perspective top views illustrating singulated submount based light emitter components according to the disclosure herein.

Filler material 22 can provide both environmental and mechanical protection of individual light emitter components (e.g., 30, FIG. 2A). In some aspects, an optional layer of optical conversion material(s), such as phosphor(s) or lumiphor(s), can be applied directly over the one or more LED chips 14 and/or over one or more surfaces of filler material 22 (e.g., an inner, outer, upper, or lower surface) for producing cool and/or warm white output. In other aspects, optical conversion material is uniformly or non-uniformly dispersed within filler material 22. Optical conversion material can comprise one or more phosphors or lumiphors (e.g., yellow, red, and/or green phosphor) which is activated by light emitted from the one or more LED chips 14. In some aspects, optical conversion material is provided when filler material 22 is in liquid form and fixed therein as filler material 22 cures.

The broken lines in FIG. 1E illustrate separation or singulation lines "S", along which individual light emitter devices or components, generally designated 30, can be singulated, or separated from each other. Individual components 30 can be separated from each other via sawing, breaking, dicing, shearing, scribing, machining, cutting, grinding, laser cutting, and/or combinations thereof. Notably, singulation lines S extend through portions of reflective walls 18 such that upon singulation, reflective walls 18 are cut in half for forming interior and exterior walls of one or more individual light emitter components 30. Retention walls 18 can be dispensed in any location, shape, and/or orientation over panel P.

A plurality of light emitter components 30 can be formed and easily manufactured via batch processing over panel P. Batch processes may include depositing traces, die attaching, wirebonding, dispensing/forming walls 18, dispensing/forming optical elements comprised of filler material 22, curing, and/or singulating. FIGS. 1A to 1E illustrate providing a panel P, providing traces 10 over panel P, attaching LED chips 14 to panel P, wirebonding LED chips 14 to each other and/or to traces 10, providing a reflector or reflective walls over the panel P and about one or more LED chips 14, providing filler material 22 between one or more opposing walls 18, and singulating individual components 30 from a plurality of components formed on panel P.

FIGS. 2A to 2H illustrate aspects of singulated, individual light emitter components 30. Notably, components 30 are devoid of a costly leadframe encased within molded plastic, but rather utilizes thin electrically conductive traces 10 which can be customized with respect to size, placement, layout, and/or electrical configuration with respect to LED chips 14 and bottom contacts (e.g., 36 and 38, FIG. 2D). Individual light emitter components 30 can each comprise an individual submount 32 over which LED chips 14 are provided, where each submount 32 is a portion of panel P, which is singulated from panel P during a singulation process (e.g., sawing, dicing, laser cutting, shearing, breaking, etc.). Submount 32 can comprise any size, shape, and/or cross-sectional shapes. For illustration purposes, a substantially square shape having a substantially rectangular cross-sectional shape is illustrated, however, any other non-square and non-rectangular shape(s) can be provided.

Notably, a plurality of components 30 are formed over panel P of respective submounts 32. Panel P, and respective submounts 32, can comprise the building blocks of customized SMD type emitter components or packages described herein. For example, in some aspects, single or multi-chip components can be provided, components having any size, shape, and/or pattern of traces can be provided, and components having the same or differently colored LED chips can be provided over and/or around portions of the panel P and respective submounts 32. Customized reflective cavities (e.g., comprised of walls 18) can also be formed about the LED chips 14, which can advantageously increase brightness and light extraction per component 30. A plurality of different customized components can be provided without the expense of fabricating customized molded/pressed/fired ceramic reflector walls and/or customized molded plastic leadframe components.

Still referring to FIG. 2A, component 30 can comprise one or more opposing reflective walls 18 provided over a highly reflective submount 32. Reflective walls 18 can comprise a secondary reflector comprised of reflective silicone or plastic material and can be sawn through during singulation. Thus, outer surfaces of reflective walls 18, which also form outer surfaces of component 30, can be substantially planar, vertical and/or smooth. However, curved walls 18 can also be provided. As noted earlier, filler material 22 is retained within and/or by reflective walls 18. In FIG. 2A, features disposed below reflective walls 18 and filler material are indicated in broken lines, as such features are present, but may not be visible from the outside of component 30. For example, a plurality of LED chips 14 can be electrically connected in series and/or parallel between traces 10. At least one pair of traces 10 is provided per component 30, where a first trace 10 is the anode and the other, second trace is the cathode. Together, the traces 10 supply electrical current to the chips via wirebonds 16. Notably, traces 10 and at least some wirebonds 16 can be partially or fully disposed under, below, and/or within reflective walls 18. More than one pair of traces can also be provided per light emitter component, as described below with respect to FIGS. 3A and 3B.

Submount 32 comprises a portion of panel P, and therefore comprises a non-metallic material. In some aspects, submount 32 comprises a ceramic based material, such as a transparent, semi-transparent, opaque, or otherwise highly reflective ceramic material for maximizing light extraction and reflectance. In some aspects, a submount according to any of the embodiments described herein can have a desirable thermal conductivity. For example and without limitation, submount 32 can have a thermal conductivity of greater than approximately 5 W/mK, greater than approximately 10 W/mK, greater than approximately 50 W/mK, greater than approximately 100 W/mK, greater than approximately 150 W/mK, or greater than approximately 200 W/mK. In more particular aspects, the thermal conductivity of the submount 32 can be approximately 20 W/mK (+ or −5 W/mK), such as for when the submount comprises alumina, or the thermal conductivity of the submount can be approximately 170 W/mK (+ or −5 W/mK), such as for when the submount comprises AlN.

Component 30 can further comprise at least one ESD protection device 34 electrically connected to traces 10 via one or more wirebonds 16. ESD protection device 34 is reversed biased with respect to LED chips 14. ESD protection device 34 can comprise a vertical device that is reversed biased or electrically connected in reverse polarity to LED chips 14. ESD protection device 34 can, for example, comprise a vertical silicon (Si) Zener diode, a dual back-to-back Zener diode, a different LED chip arranged in parallel and reverse biased to LED chip 14, a surface mount varistor, and/or a lateral Si diode.

ESD protection device 34 can be mounted using any known material and/or technique. ESD protection device 34 can be smaller than LED chips 14 so that it does not cover an excessive area on the surface of the submount 32, and be covered by reflective walls 18 so that it does not block and/or absorb a significant amount of light. ESD protection device 34 can prevent excessive current from passing through component 30 from an ESD event by providing an alternative path for current flow besides the LED chips 14. Notably, traces 10 and ESD protection device 34 can be confined to outermost edges of submount 32, such that each terminates underneath and/or within portions of reflective walls 18. Wirebonds 16 extending from ESD protection device 34 and/or LED chips 14 terminate under, below, and/or within portions of the reflective dam or reflective walls 18. Stated differently, component 30 comprises an SMD in which electrical traces 10, wirebonds 16, and/or ESD protection device 34 are concealed (e.g., fully or at least partially) by and/or within reflective walls 18. Traces 10 are either fully concealed via reflective wall 18, or covered via filler material 22. Component 30 is devoid of uncovered traces 10 on a top surface thereof.

Figure 2B:
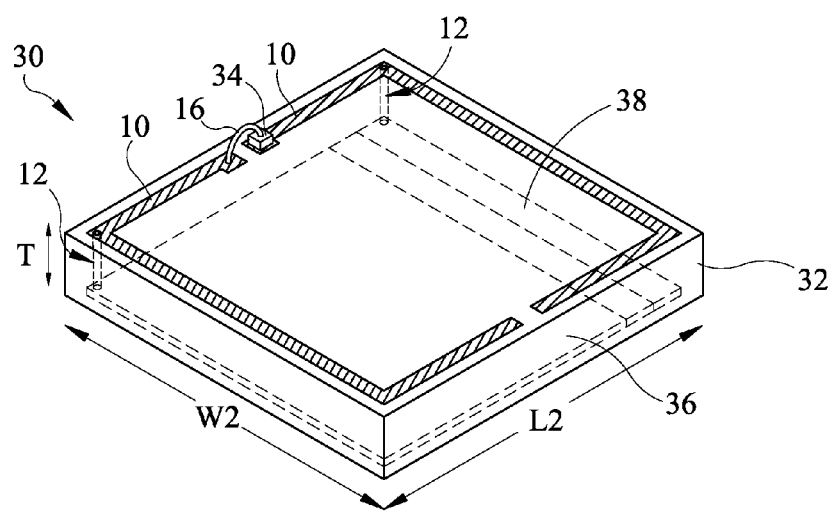

FIG. 2B illustrates submount 32, traces 10, and ESD protection device 34 in more detail. Vias 12 are also more readily visible, and are illustrated as extending internally within submount 32. The internal portions of vias 12 are illustrated in broken lines, as they may not be visible from the outside of submount 32.

In some aspects, submount 32 can comprise a length L2 and width W2 of approximately 5 mm×5 mm, or a surface area of approximately 25 mm$^2$. As noted above however, any size and/or shape of submount 32 can be provided (e.g., where L2 or W2 is approximately 10 mm or less, where L2 or W2 is approximately 7 mm or less, where L2 or W2 is approximately 5 mm or less, or where L2 or W2 is approximately 3 mm or less, etc.). Submount 32 can be any thickness T, such as between approximately 0.35 and 1.0 mm thick. In some aspects, T is approximately 0.6 mm, or 0.635 mm. Submount 32 can also be a thickness T that is greater than 1.0 mm (e.g., 2.0 mm, 3.0 mm, etc.) where desired.

In some aspects, traces 10 comprise a small surface area relative to the top surface area of submount 32. For example, traces 10, taken together, can comprise a total surface area of less than approximately one-half (50%) of the surface area of submount 32 (e.g., less than approximately 12.5 mm$^2$ total surface area), less than approximately 40% of the surface area of submount 32 (e.g., less than approximately 10 mm$^2$ total surface area), less than approximately 30% of the surface area of submount 32 (e.g., less than approximately 7.5 mm$^2$ total surface area), less than approximately 20% of the surface area of submount 32 (e.g., less than approximately 5 mm$^2$ total surface area), less than approximately 10% of the surface area of submount 32 (e.g., less than approximately 2.5 mm$^2$ total surface area), or less than approximately 5% of the surface area of submount 32 (e.g., less than approximately 1.25 mm$^2$ total surface area).

Traces 10 can comprise one more layers of copper (Cu), titanium (Ti), nickel (Ni), Ag, electroless Ag, Au, electroless nickel immersion gold (ENIG), Sn, palladium (Pd), electrolytic or immersion Au, or another other material which can be applied via any suitable process, such as for example a deposition process, such as physical or plasma deposition, sputtering, e-beam or, electroplating, and/or electroless plating processes. Different layers of metals can be applied or coated in layers over each other. For example, a layer of Ti can be deposited directly over submount 32 and can be coated with one or more layers of Ag and Cu. In other aspects, different and/or alternating metallic layers can be applied over submount 32. In some aspects, traces 10 comprise at least one layer of reflective Ag, either alone or in combination with layers of Ti, Ni, Cu, and/or Au.

Figure 2C:
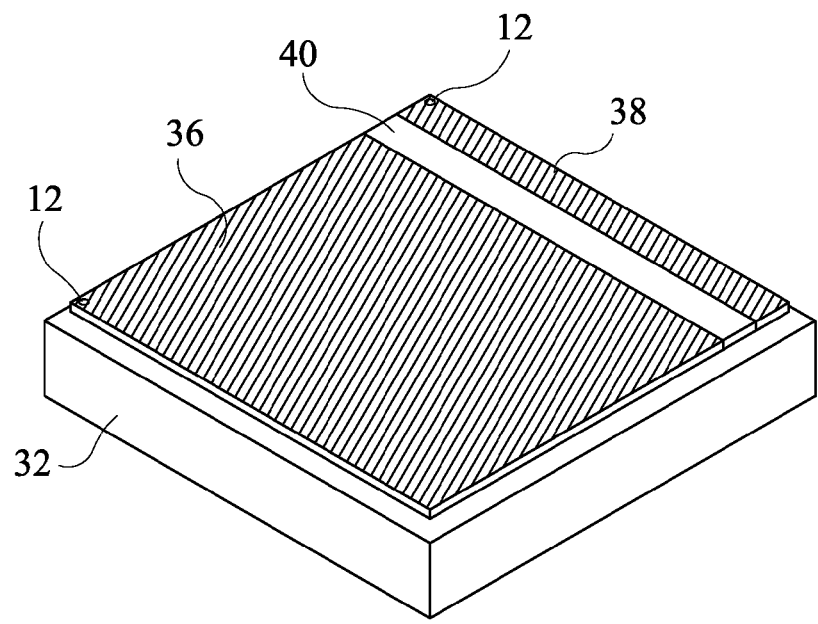

As FIG. 2C illustrates, in some aspects, component 30 comprises first and second electrical contacts 36 and 38 disposed on a bottom surface of submount 32. First and second contacts 36 and 38 are separated from each other via an insulating member 40, comprised of an electrically insulating material. Contacts 36 and 38 comprise SMD pads or contacts configured to electrically communicate with an external circuit, and optionally thermally communicate with an external heat sink. In some aspects, the circuit is also the heat sink. In other aspects, the heat sink and circuit can comprise separate components.

First and second contacts 36 and 38 can electrically communicate to or with traces 10 by the one or more internally disposed thru-holes or vias 12. Vias 12 can extend internally within a portion of submount 32 depending upon on how placed within panel (e.g., FIG. 1A) and how panel is subdivided into individual submounts. For example, vias 12 can be fully internal to, intact, and/or fully contained within portions of submount 32 as shown, or in other aspects, vias 12 can be apportioned and exposed such that they are disposed along one or more external sides of submount 32. Vias 12 can comprise conduits for transferring electrical current between first and second top contacts 36 and 38 and respective traces 10. Thus, vias 12 also comprise conduits for passing electrical current to and from LED chip 14 within component 30.

In some aspects, first and second contacts 36 and 38 can comprise metallic bodies or portions of electrically conductive material that can be attached to submount 32 via adhesive, solder, glue, epoxy, paste, silicone, or any other material. In other aspects, first and second contacts 36 and 38 can comprise metallic bodies or portions of material that can be pressed into a green ceramic tape and then co-fired with submount 32. In other yet further aspects, first and second contacts 36 and 38 can be applied to submount 32 via a conductive paste screen-printed over an HTCC panel P (e.g., FIGS. 1A-1E) and fired. In some aspects, a conductive Ag paste can be used.

Figure 2D:
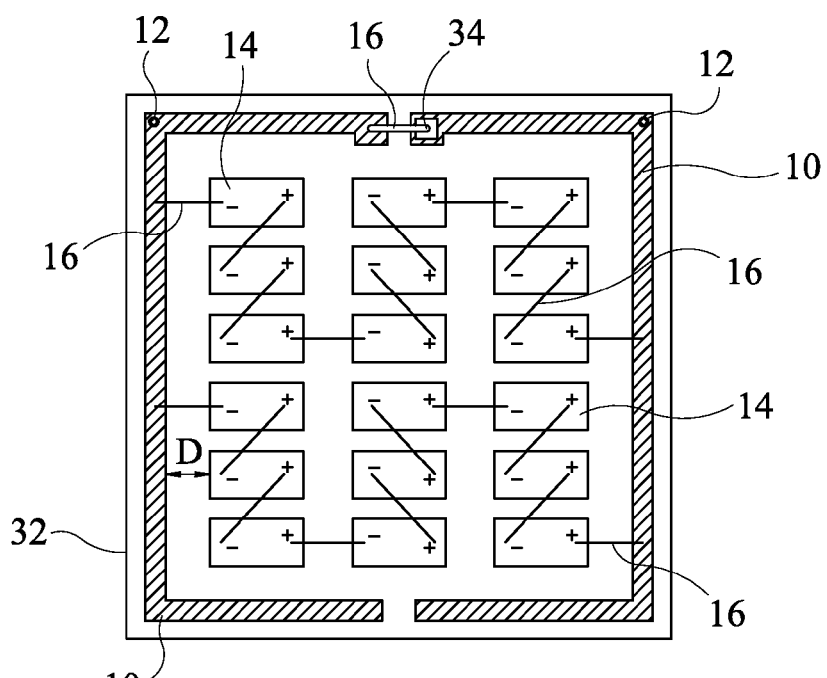

FIG. 2D illustrates one embodiment of LED chip placement within component 30. LED chips 14 are schematically illustrated in FIG. 2D, where the anode is designated by a "+" sign and the cathode is designated by a "−" sign. Thus, LED chips 14 comprise horizontal chips, with both positive and negative contacts disposed on an upper surface thereof. Other chip structures, including contacts on the bottom or vertical chips having top/bottom contacts, can be provided. Each LED chip 14 can comprise substantially straight-cut lateral sides or beveled (e.g., sloped or inclined) lateral sides and can comprise any shape, size, dimension, structure, build, and/or color. In some aspects, LED chips 14 can comprise a growth or carrier substrate, for example one comprising or consisting of sapphire. As FIG. 2D illustrates, LED chips 14 can be serially connected between traces 10. LED chips 14 can also be connected in parallel between traces 10. As FIG. 2D illustrates, strings of serially connected LED chips 14 can be connected in parallel between traces 10.

In some aspects, only a single LED chip 14 can be provided between traces 10. However, in other aspects multiple chips 14 can be provided over and/or supported by submount 32 between traces 10 for achieving a higher brightness than can be emitted by a single chip. LED chips 14 can be disposed proximate a center of submount 32 and/or distributed across at least 30%, 40%, 50%, or more than 60% of the surface area of submount 32. LED chips 14 can be provided at equal distances from each other, or randomly spaced apart. In some aspects, LED chips 14 are spaced apart from each other by at least approximately 50 μm or more, at least approximately 100 μm or more, at least approximately 200 μm or more, at least approximately 300 μm or more, at least approximately 400 μm or more, or more than 500 μm apart. In some aspects, LED chips are spaced apart from each other by about 190 μm.

In some aspects as FIG. 2D illustrates, LED chips 14 can be spaced apart from traces 10 by at least a distance D. Distance D can be at least approximately 100 μm or more, at least approximately 200 μm or more, at least approximately 300 μm or more, or more than 500 μm. In some aspects, distance D is approximately 320 µm. A distance D of more than 100 µm is advantageous, as the surface area and/or space available for light reflectors, such as the highly reflective submount 32 and walls 18, can be increased, thereby improving light extraction and/or brightness per component 30.

Multiple LED chips 14, where provided, can be configured to emit a same color of light, or different colors of light. LED chips 14 can be configured to emit light that is primarily blue, blue shifted yellow (BSY), cyan, green, red, yellow, red-orange, orange, amber, and/or white. Any color of LED chip 14 can be provided. LED chips 14 can be configured to activate a yellow, red, and/or green phosphor disposed either directly over LED chip 14 and/or over or within a portion of walls 18 and/or filler material 22 (FIG. 2A) for producing cool and/or warm white output.

In further embodiments, one or more primarily red LED chips 14 can be included in emitter component 30 and can be used alone and/or combination with one or more BSY chips 14. In some aspects, a red LED chip 14 can also optionally be disposed below a phosphor, encapsulant or filler material 22 (FIG. 2A) with a phosphor layer and/or uniformly dispersed phosphors for mixing to produce warm white output.

LED chips 14 can comprise any size and/or shape. LED chips 14 can be substantially square, rectangular, regular, irregular, or asymmetrical in shape. In some aspects, LED chips 14 can, for example, comprise a footprint where at least one side (e.g., a length or width) measures approximately 2000 µm or less, such as approximately 1000 µm or less, approximately 900 µm or less, approximately 700 µm or less, approximately 600 µm or less, approximately 500 µm or less, approximately 400 µm or less, approximately 300 µm or less, approximately 200 µm or less, approximately 100 µm or less, and/or combinations thereof where multiple LED chips 14 are used. Any dimension of LED chip(s) 14 can be provided.

The size and/or number of LED chips 14 can vary depending upon the desired output or operability of component 30. FIG. 2D illustrates 18 LED chips 14, however, more or less than 18 chips can be provided. For example, 50 chips can be provided, 24 chips can be provided, 16 chips can be provided, 12 chips can be provided, 8 chips can be provided, etc. Component 30 is configured to operate at any suitable voltage, such as for example between approximately 3 volts (V) and 72V. That is, component 30 can be configured with performance-specific numbers, size, and/or layout of LED chips 14, vias 12, and/or top/bottom contacts 36 and 38 for operability at 3V, 9V, 12V, 18V, 24V, 36V, 48V, and/or 72V.

Component 30 is configured to deliver at least 50 lumens per Watt (LPW) or more, at least 100 LPW or more, at least 110 LPW or more, or more than 160 LPW.

In some aspects, component 30 is configured to emit white light having a reference point on the blackbody locus (e.g., 1931 CIE Chromaticity Diagram) having a color temperature of less than or approximately equal to 5000 K, less than or approximately equal to 4000 K, less than or approximately equal to 3500 K, less than or approximately equal to 3000 K, or less than or approximately equal to 2700 K. In some aspects, combined emissions from component 30 embodies a color rendering index (CRI Ra) value of at least 70, at least 75, at least 80 (e.g., 82 or 85), or at least 90 or more.

FIGS. 2E to 2H are sectional views of light emitter component 30. Sectional views illustrate various different types, sizes, and/or shapes of customized reflectors, such as reflective walls 18. Walls can be customized for performance, operability, and/or use in various light applications.

Figure 2E:
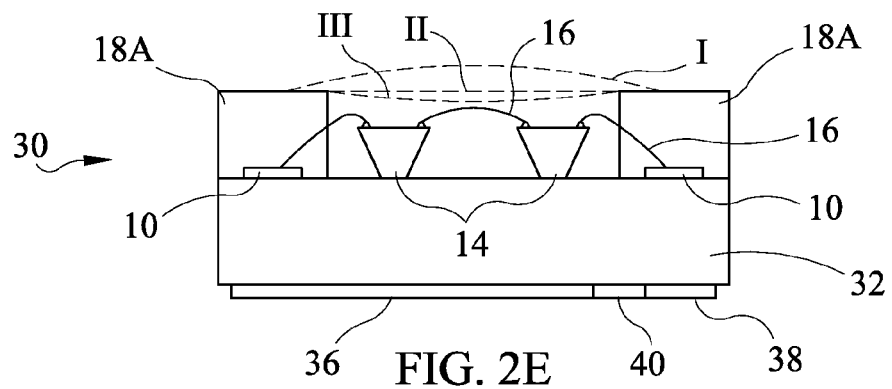
FIGS. 2E to 2H are cross-sectional views illustrating submount based light emitter components according to the disclosure herein.

FIG. 2E illustrates a component 30 having reflective walls 18A of a substantially square shaped cross-section. Individual components 30 are built and batch processed over a ceramic panel (e.g., P, FIG. 1E) prior to singulation therefrom. During singulation, reflective dams or walls that are dispensed between adjacent components 30 are cut in half, such that one dispensed dam or reflector becomes split between at least two adjacent components. Reflective walls 18A form external walls of individual components 30. Reflective walls 18A can comprise substantially planar inner walls which retain filler material 22, such as to confine phosphor for example that is disposed over the submount, substantially planar outer walls, or both planar inner and outer walls, which can also be substantially parallel. During singulation, smooth reflective walls 18A can be formed. The cross-sectional shape of reflective walls 18A can be customized for producing resultant customized beam patterns and/or beam shapes.

The level at which filler material (e.g., 22, not shown in FIG. 2E for illustration purposes) is selectively provided can also be customized. For example, filler material can be filled to a first level, designated I, a second level, designated II, or a third level, designated III. First level I can be disposed above an uppermost surface of reflective walls 18A, and can even cover a portion of the upper surfaces of reflective walls 18A. Second level II is substantially planar with respect to the upper surfaces of reflective walls 18A. Third level III is lower than an upper surface of reflective walls 18A. Filler material can be at least partially curved, for example, at least partially concave or convex.

Figure 2F:
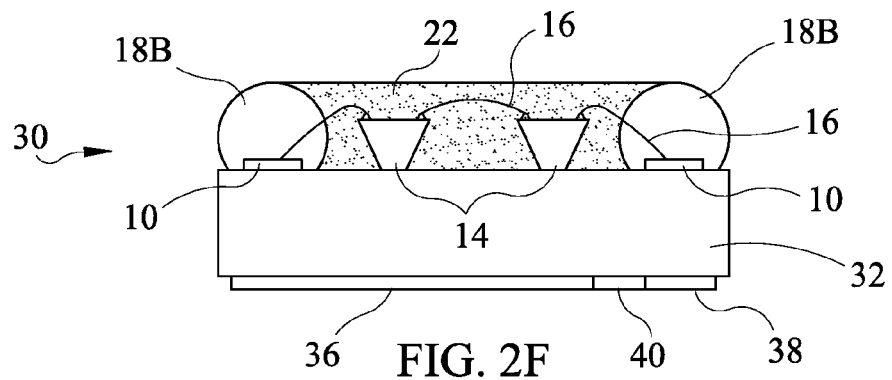

FIG. 2F illustrates component 30 having substantially rounded or curved cross-sectional reflective walls 18B. Tools used to saw or separate reflective walls 18B can customize the shape of walls 18B for improved light reflection. Rounding or curving walls 18B may produce different beam shapes or patterns as compared to planar, flat, or vertical walls (e.g., 18A). In some aspects, filler material 22 can comprise one or more optical conversion materials dispersed therein. Such materials are designated by the speckled appearance of 22 and can comprise phosphors or lumiphors which can be uniformly or non-uniformly dispersed and set within filler material 22.

Figure 2G:
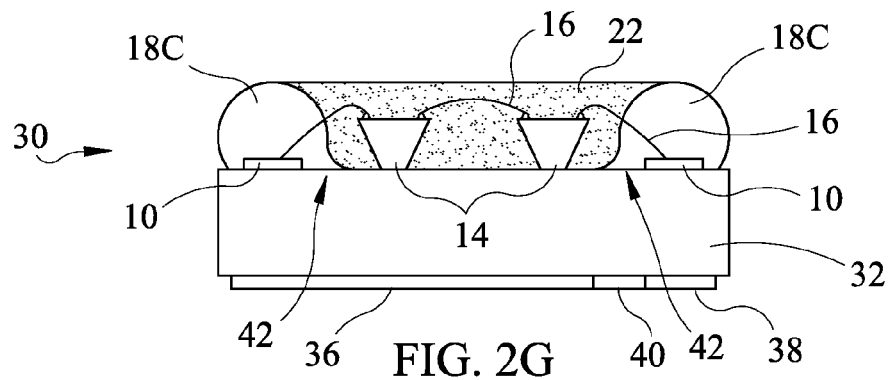
Figure 2H:
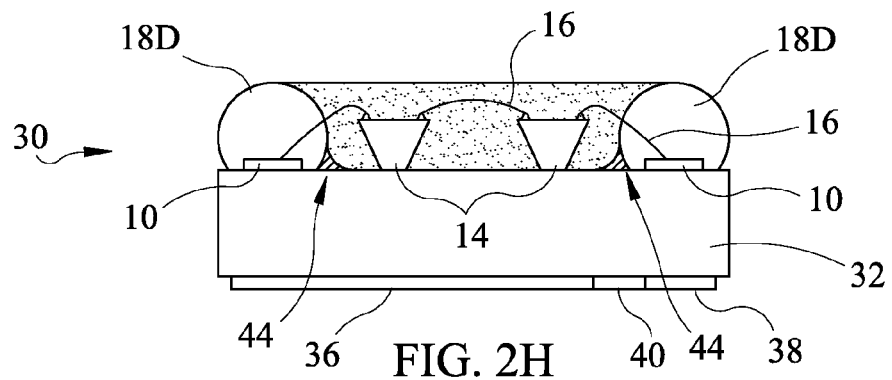

FIGS. 2G and 2H also illustrate substantially rounded or curved reflective walls 18C and 18D, respectively. In FIG. 2G, reflective walls 18C comprise an inclined lower surface 42 or lower surface feature, which gradually slopes towards LED chips 14. Reflective walls 18C comprise an integrally formed fillet, which is also an additional reflector of light. The inclined lower surface 42 can also prevent bubbles from forming within filler material 22 and improve brightness and light extraction per component 30.

In FIG. 2H, an additional, separate reflector 44 can be provided or retained within reflective walls 18D. The additional reflector 44 can reflect light from LED chips 14, as well as prevent bubbles from forming within filler material 22. Secondary reflector 44 an be disposed inboard of reflective walls 18D, and in some aspects, is dispensed directly adjacent to walls 18D in order to fill any voids that may exist between walls 18D and submount 32.

Figure 3A:
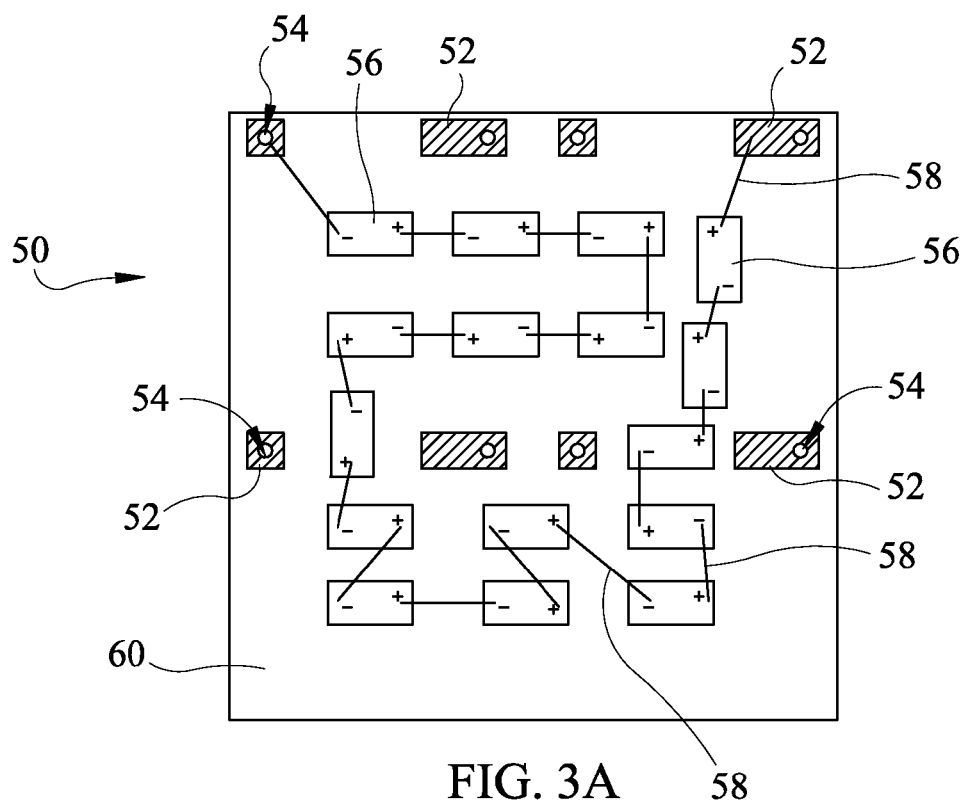
FIGS. 3A and 3B are top and bottom views, respectively, illustrating another embodiment of a submount based light emitter component according to the disclosure herein.
Figure 3B:
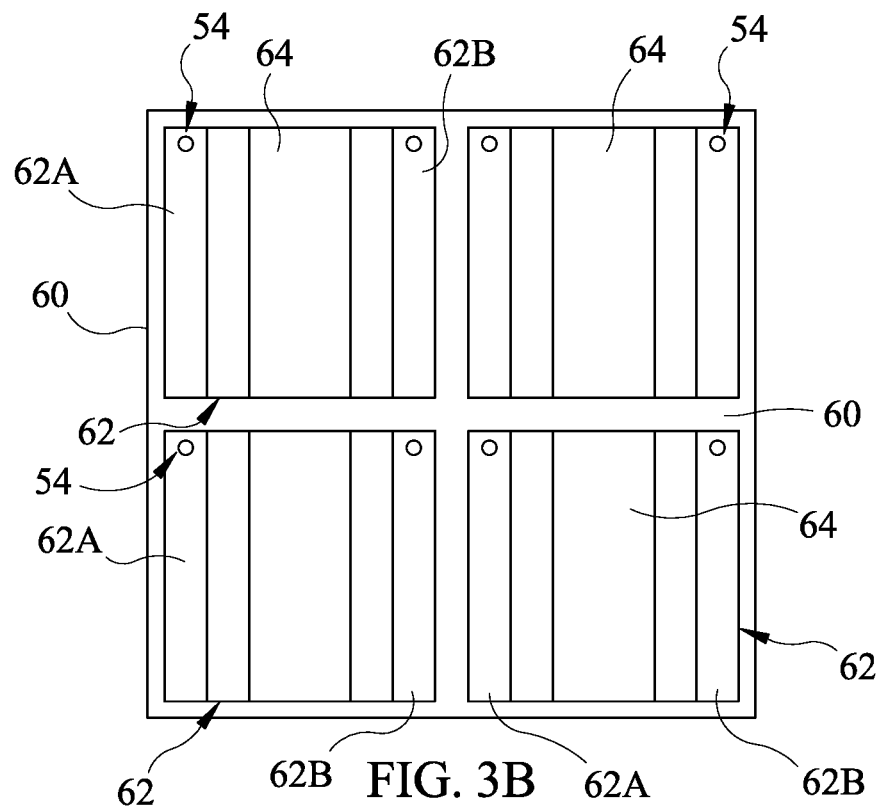

FIGS. 3A and 3B are top and bottom plan views of an additional embodiment of a light emitter component. Light emitter component 50 can comprise a submount 60 over which a plurality of traces 52 are formed or deposited. Some of the traces 52 can be covered by a reflective wall (not shown for illustrative purposes), while other traces 52 can remain exposed (e.g., not concealed by a reflector) on an upper surface of submount 52. The exposed traces 52 can then be covered with filler material (22, FIG. 2A), which is not shown in FIG. 3A for illustrative purposes.

In some aspects, traces 52 are thus either covered via a non-ceramic reflector (e.g., wall 18) or filler material (e.g., 22). Traces 52 which remain exposed and not covered by a reflective wall can comprise an additional reflector, as traces 52 can comprise highly reflective Ag. Vias 54 can be formed within submount 60 to connect traces 52 to bottom contacts (e.g., 62A and 62B, FIG. 3). A plurality of LED chips 56 can be connected in parallel between traces 52 via wirebond or wirebond connectors 58. Notably, multiple traces 52 can form multiple anode/cathode pairs for passing current through multiple strings of LED chips 56.

As FIG. 3B illustrates, the backside of component 50 with submount 60 can comprise a different layout of backside contacts than component 30. For example, component 50 can have multiple pairs of backside contacts, each pair collectively designated 62. In some aspects, component 50 can comprise at least two pairs of backside contacts 62, three pairs, or four or more pairs of contacts 62. Each pair of backside contacts 62 is electrically connected to a pair of traces 52 by vias 54. Each pair of contacts 62 can comprise of a first contact 62A and a second contact 62B. One is an anode, and the other is a cathode. An optional thermal pad 64 can be provided between first and second contacts 62A and 62B. The backside of component 50 can be customized for providing components operable at higher or lower voltages, ranging for example from between approximately 3V and 72V, where desired.

Figure 4:
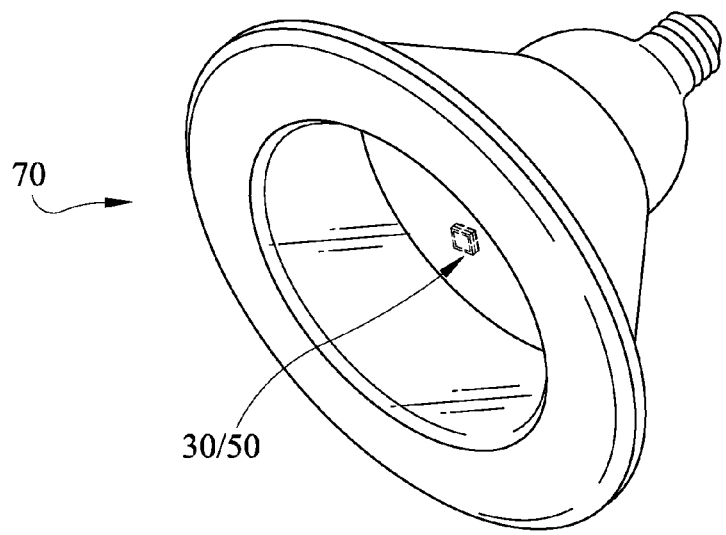
FIG. 4 is a lighting fixture incorporating a submount based light emitter component according to the disclosure herein.

FIG. 4 is a lighting fixture, generally designated 70. Lighting fixture 70 can incorporate at least one component 30/50 therein. In some aspects, multiple components 30 and/or 50 can be disposed within a single lighting fixture 70. Lighting fixture 70 can comprise a down light or a can light. Any style of lighting fixture can be provided, and fixtures for different lighting applications can be provided.

Lighting fixture 70 can deliver at least 50 LPW or more, at least 100 LPW or more, at least 110 LPW or more, or more than 160 LPW. In some aspects, lighting fixture is configured to emit white light having a reference point on the blackbody locus (e.g., 1931 CIE Chromaticity Diagram) having a color temperature of less than or approximately equal to 5000 K, less than or approximately equal to 4000 K, less than or approximately equal to 3500 K, less than or approximately equal to 3000 K, or less than or approximately equal to 2700 K. In some aspects, combined emissions from fixture 70 embody a color rendering index (CRI Ra) value of at least 70, at least 75, at least 80 (e.g., 82 or 85), or at least 90 or more. Lighting fixture 70 can also be dimmable via a triac dimmer circuit, where desired.

Figure 5:
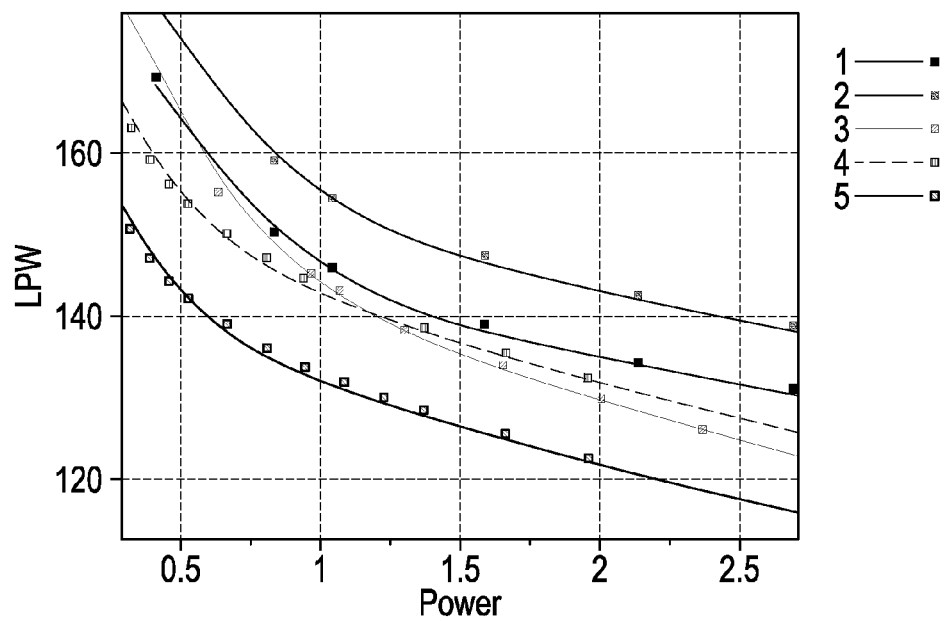
FIG. 5 is a graphical illustration of optical properties associated with submount based light emitter components, according to the disclosure herein.

FIG. 5 is a plot which graphically illustrates optical properties associated with different light emitter components disclosed herein. As FIG. 5 illustrates, components (e.g., 30, 50) according to the disclosure herein are configured to deliver more than 120 LPW, more than 140 LPW, or 160 LPW or more at between approximately 0.5 and 2.5 W.

Customized emitter components described herein can be easily produced as the time consuming process and additional cost associated providing customized packages or components (e.g., customized pressed or molded plastic bodies, cavities, and/or individually molded optical elements) becomes obsolete. A multitude of different customized components, having customized colors, brightness, voltage, power, layout, sizes, and/or reflectors can be provided without the expense of creating custom fabricated components and/or leadframe components.

Embodiments as disclosed herein may, for example and without limitation, provide one or more of the following beneficial technical effects: reduced cost of providing light emitter components; reduced processing time; improved light reflection; improved light extraction; improved brightness; improved LPW per power density; improved manufacturability of light emitter components; improved ability to vary component features, such as trace design, number of LED chips, and reflector layout.

While the components and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitter component, comprising:
   a ceramic submount;
   at least a first pair of electrical traces disposed on a first side of the submount;
   at least a first pair of electrical contacts disposed on a second side of the submount, wherein the first pair of electrical contacts is configured to electrically communicate with the first pair of electrical traces;
   at least one light emitter chip disposed on the first side of the submount, the at least one chip being configured to electrically communicate with the first pair of electrical traces; and
   a non-ceramic reflector disposed about the at least one light emitter chip, wherein at least a portion of the reflector is configured to conceal a portion of each trace of the first pair of electrical traces.

2. The component of claim 1, wherein the reflector comprises a reflective wall.

3. The component of claim 2, wherein the reflective wall is polymeric.

4. The component of claim 1, wherein the reflector comprises silicone or epoxy having reflective particles dispersed therein.

5. The component of claim 4, wherein the reflective particles comprise titanium dioxide ($TiO_2$), zinc peroxide ($ZnO_2$), silicone dioxide ($SiO_2$), or zirconia ($ZrO_2$) particles.

6. The component of claim 1, wherein the at least one chip is configured to electrically communicate with the first pair of electrical traces via wirebond connectors.

7. The component of claim 6, wherein the reflector conceals the wirebond connectors.

8. The component of claim 1, further comprising an electrostatic discharge (ESD) protection device, wherein the ESD protection device is concealed by the reflector.

9. The component of claim 1, wherein the component is configured to deliver approximately 100 lumens per Watt (LPW) or more.

10. The component of claim 1, wherein the component is configured to deliver approximately 120 lumens per Watt (LPW) or more.

11. The component of claim 1, further comprising a plurality of light emitter chips.

12. The component of claim 11, wherein the plurality of light emitter chips is serially connected between the first pair of traces.

13. The component of claim 11, wherein the plurality of light emitter chips comprises multiple strings of serially connected light emitter chips, and wherein each string of light emitter chips is electrically connected in parallel between the first pair of traces.

14. The component of claim 1, wherein the ceramic submount comprises alumina, zirconia, or a mixture, composite or alloy thereof.

15. The component of claim 1, wherein the light emitter component comprises a surface mount design (SMD).

16. The component of claim 1, wherein the reflector confines phosphor that is disposed over the ceramic submount.

17. A substrate for light emitter components, the substrate comprising:
a ceramic panel; and
a plurality of adjacent light emitter components disposed over the panel, wherein each light emitter component comprises:
a plurality of electrical traces disposed on the panel;
a plurality of electrical contacts disposed on the panel, wherein at least some of the electrical contacts are configured to electrically communicate with at least some of the electrical traces;
a plurality of light emitter chips disposed on the panel, wherein at least some of the plurality of chips are configured to electrically communicate with at least some of the electrical traces; and
a plurality of non-ceramic reflectors disposed between adjacent light emitter components, at least a portion of the reflector being configured to conceal portions of the electrical traces.

18. The substrate of claim 17, wherein the panel comprises alumina, zirconia, or a mixture, composite or alloy thereof.

19. The substrate of claim 17, wherein the reflectors comprise reflective walls.

20. The substrate of claim 19, wherein the reflective walls are polymeric.

21. The substrate of claim 17, wherein the reflectors comprise silicone or epoxy having reflective particles dispersed therein.

22. The substrate of claim 21, wherein the reflective particles comprise titanium dioxide ($TiO_2$), zinc peroxide ($ZnO_2$), silicone dioxide ($SiO_2$), or zirconia ($ZrO_2$) particles.

23. The substrate of claim 17, wherein the reflectors are configured to conceal wires connecting at least some of the plurality of chips to at least some of the traces.

24. The substrate of claim 17, wherein the reflectors are configured to conceal a plurality of electrostatic discharge (ESD) protection devices that are disposed over the panel.

25. The substrate of claim 17, comprising at least 120 adjacent light emitter components.

26. The substrate of claim 17, wherein each light emitter chip is spaced apart from at least one trace by at least approximately 100 μm or more.

27. The substrate of claim 17, wherein each light emitter chip is spaced apart from each other light emitter chip by at least approximately 100 μm or more.

28. The component of claim 17, wherein the light emitter component comprises a surface mount design (SMD).

29. The component of claim 17, wherein the reflector confines phosphor that is disposed over the ceramic submount.

30. A method of providing one or more light emitter components, the method comprising:
providing a ceramic submount;
providing at least a first pair of electrical traces on a first side of the submount;
providing at least a first pair of electrical contacts on a second side of the submount, the first pair of electrical contacts being configured to electrically communicate with the first pair of electrical traces;
attaching at least one light emitter chip to the first side of the submount, the at least one chip being configured to electrically communicate with the first pair of electrical traces; and
dispensing a non-ceramic reflector about the at least one light emitter chip, wherein at least a portion of the reflector is configured to conceal a portion of each trace of the first pair of electrical traces.

31. The method of claim 30, wherein the non-ceramic reflector comprises a polymeric reflector.

32. The method of claim 30, further comprising dispensing a filler material between opposing surfaces of the reflector.

33. The method of claim 32, wherein the filler material comprises encapsulant.

34. The method of claim 30, wherein the ceramic submount comprises alumina, zirconia, or a mixture, composite or alloy thereof.

35. The method of claim 30, wherein the reflector comprises silicone having reflective particles dispersed therein.

36. The method of claim 35, wherein the reflective particles comprise titanium dioxide ($TiO_2$), zinc peroxide ($ZnO_2$), silicone dioxide ($SiO_2$), or zirconia ($ZrO_2$) particles.

37. The method of claim 30, wherein attaching the at least one chip comprises wirebonding the at least one chip to each trace of the first pair of traces.

38. The method of claim 37, wherein the reflector conceals wirebonds for the wirebonding.

39. The method of claim 30, further comprising providing an electrostatic discharge (ESD) protection device over the first surface of the submount, and wherein the reflector is dispensed over the ESD protection device.

40. The method of claim 30, further comprising a plurality of light emitter chips, and wherein the light emitter chips are serially connected between the first pair of traces.

41. The method of claim 30, comprising sawing through at least a portion of the reflector to singulate the light emitter component.

42. The method of claim 30, comprising spacing apart each light emitter chip from the electrical traces.

43. A light emitter component, comprising:
a ceramic submount;
at least a first pair of electrical traces disposed on a first side of the submount;
at least one light emitter chip disposed on the first side of the submount, the at least one light emitter chip being configured to electrically communicate with the first pair of electrical traces; and a non-ceramic reflector disposed about the at least one light emitter chip, wherein at least a portion of the reflector is configured to conceal each trace of the first pair of electrical traces.

44. The component of claim 43, wherein the at least one light emitter chip is spaced apart from the traces.

45. The component of claim 43, wherein the reflector is proximate an edge of the submount.

* * * * *